(12) United States Patent
Hussell et al.

(10) Patent No.: US 10,573,543 B2
(45) Date of Patent: Feb. 25, 2020

(54) APPARATUS AND METHODS FOR MASS TRANSFER OF ELECTRONIC DIE

(71) Applicant: Cree, Inc., Durham, NC (US)

(72) Inventors: Christopher P. Hussell, Cary, NC (US); Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/967,529

(22) Filed: Apr. 30, 2018

(65) Prior Publication Data

US 2019/0333791 A1 Oct. 31, 2019

(51) Int. Cl.
| | |
|---|---|
| H01L 21/67 | (2006.01) |
| H01L 33/00 | (2010.01) |
| H01L 21/683 | (2006.01) |
| H01L 25/075 | (2006.01) |

(52) U.S. Cl.
CPC .... *H01L 21/67144* (2013.01); *H01L 21/6835* (2013.01); *H01L 25/0753* (2013.01); *H01L 33/0079* (2013.01); *H01L 2221/68368* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 4,667,402 A | * | 5/1987 | Wilde .................... H01L 24/86 29/840 |
| 4,918,497 A | | 4/1990 | Edmond |
| 4,966,862 A | | 10/1990 | Edmond |
| 5,027,168 A | | 6/1991 | Edmond |
| 5,210,051 A | | 5/1993 | Carter, Jr. |
| 5,338,944 A | | 8/1994 | Edmond et al. |
| 5,359,345 A | | 10/1994 | Hunter |
| 5,393,993 A | | 2/1995 | Edmond et al. |
| 5,416,342 A | | 5/1995 | Edmond et al. |
| 5,523,589 A | | 6/1996 | Edmond et al. |
| 5,604,135 A | | 2/1997 | Edmond et al. |
| 5,631,190 A | | 5/1997 | Negley |
| 5,739,554 A | | 4/1998 | Edmond et al. |
| 5,912,477 A | | 6/1999 | Negley |
| 6,120,600 A | | 9/2000 | Edmond et al. |
| 6,187,606 B1 | | 2/2001 | Edmond et al. |
| 6,201,262 B1 | | 3/2001 | Edmond et al. |

(Continued)

OTHER PUBLICATIONS

International Search Report and Written Opinion for Application No. PCT/US2019/029150 dated Aug. 29, 2019.

*Primary Examiner* — Dung A. Le
(74) *Attorney, Agent, or Firm* — Jenkins, Wilson, Taylor & Hunt P.A.

(57) ABSTRACT

An apparatus and associated method for high speed and/or mass transfer of electronic components onto a substrate comprises transferring, using an ejector assembly, electronics components (e.g., light emitting devices) from a die sheet onto an adhesive receiving structure to form a predefined pattern including electronic components thereon, and then transferring the electronic components defining the predefined pattern onto a substrate (e.g., a translucent superstrate) for light emission therethrough to create a high-density (e.g., high resolution) display device utilizing, for example, mini- or micro-LED display technologies.

15 Claims, 9 Drawing Sheets

(56) References Cited

U.S. PATENT DOCUMENTS

| | | |
|---|---|---|
| 6,600,175 B1 | 7/2003 | Baretz et al. |
| 6,791,119 B2 | 9/2004 | Slater et al. |
| 6,853,010 B2 | 2/2005 | Slater et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,456,499 B2 | 11/2008 | Loh et al. |
| 7,564,180 B2 | 7/2009 | Brandes |
| 7,655,957 B2 | 2/2010 | Loh et al. |
| 7,802,901 B2 | 9/2010 | McMillan |
| 7,821,023 B2 | 10/2010 | Yuan et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van De Ven et al. |
| 8,044,418 B2 | 10/2011 | Loh et al. |
| 8,125,137 B2 | 2/2012 | Medendorp, Jr. et al. |
| 8,264,138 B2 | 9/2012 | Negley et al. |
| 8,337,071 B2 | 12/2012 | Negley et al. |
| 8,563,339 B2 | 10/2013 | Tarsa et al. |
| 8,729,589 B2 | 5/2014 | Hussell et al. |
| 8,866,410 B2 | 10/2014 | Negley et al. |
| 8,970,131 B2 | 3/2015 | Brandes et al. |
| 9,024,349 B2 | 5/2015 | Chitnis et al. |
| 9,131,561 B2 | 9/2015 | Athalye |
| 9,159,888 B2 | 10/2015 | Chitnis et al. |
| 9,277,605 B2 | 3/2016 | Ni |
| 9,414,454 B2 | 8/2016 | Brandes et al. |
| 9,713,211 B2 | 7/2017 | Van de Ven et al. |
| 9,793,247 B2 | 10/2017 | Yuan et al. |
| 2004/0118512 A1 | 6/2004 | Hiller et al. |
| 2005/0000634 A1 | 1/2005 | Craig et al. |
| 2005/0214963 A1 | 9/2005 | Daniels et al. |
| 2006/0221272 A1 | 10/2006 | Negley et al. |
| 2007/0104828 A1 | 5/2007 | Fornaguera |
| 2008/0124842 A1 | 5/2008 | Wang et al. |
| 2008/0210368 A1 | 9/2008 | Zakel et al. |
| 2010/0258543 A1 | 10/2010 | Mizuno et al. |
| 2014/0120640 A1 | 5/2014 | Shieh et al. |
| 2015/0257211 A1 | 9/2015 | Johnson et al. |
| 2016/0126218 A1 | 5/2016 | Kurita |
| 2017/0053901 A1* | 2/2017 | Huska .................. H01L 33/62 |
| 2018/0141163 A1* | 5/2018 | Wendt ................ B23K 26/351 |

* cited by examiner

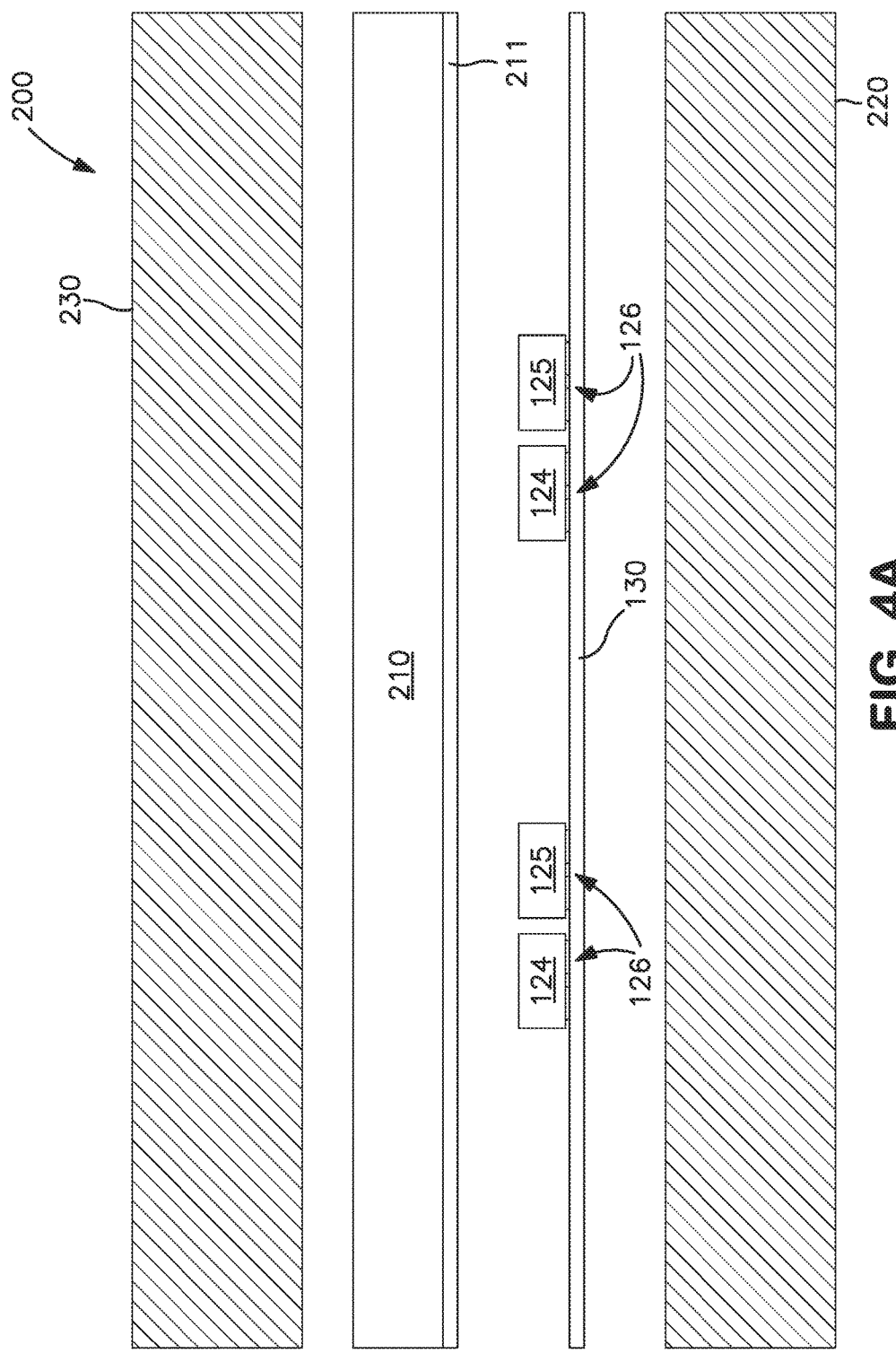

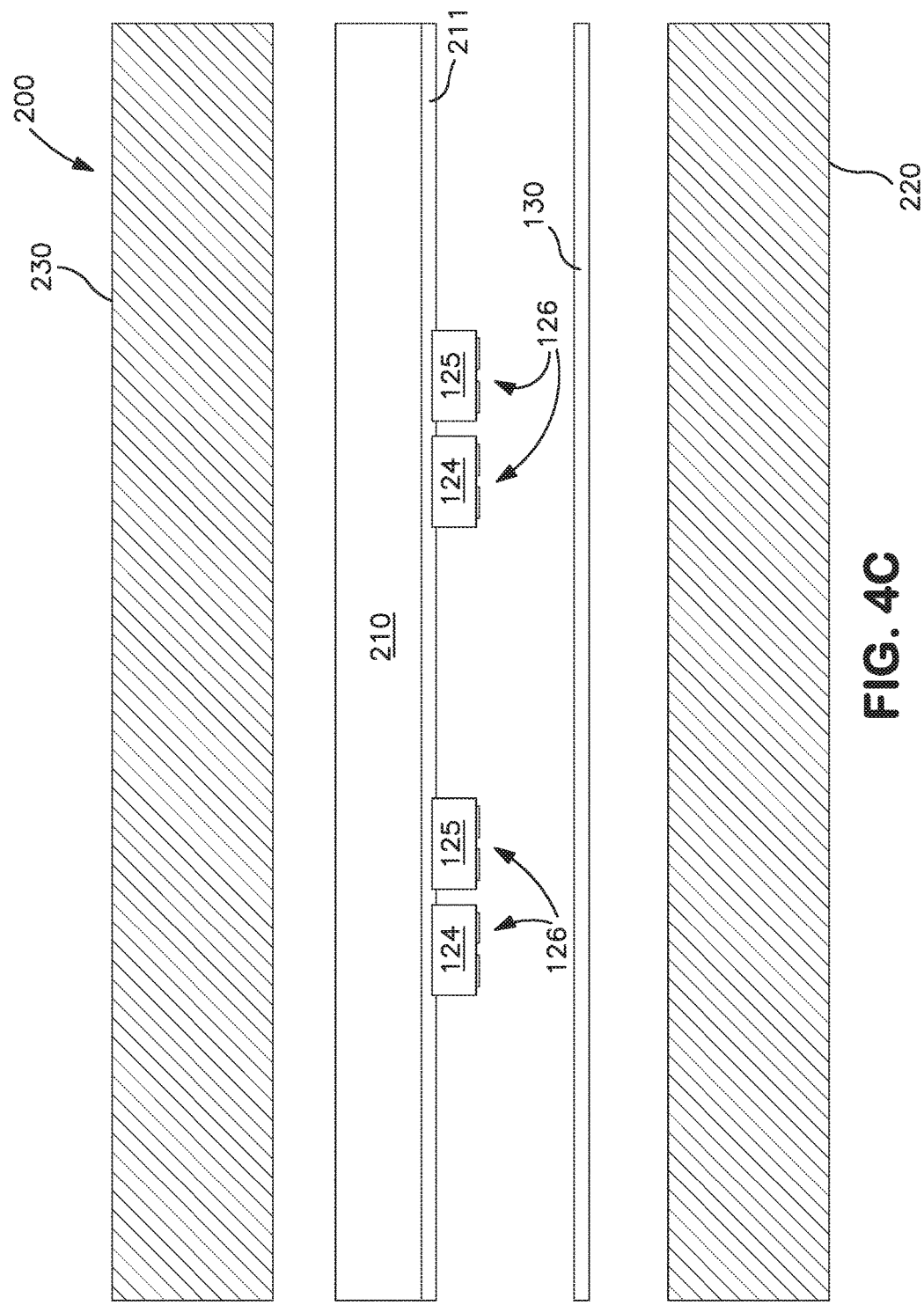

APPARATUS AND METHODS FOR MASS TRANSFER OF ELECTRONIC DIE

TECHNICAL FIELD

The present subject matter relates generally to light emitting devices, systems, and/or methods. More particularly, the subject matter disclosed herein relates to devices and methods for a high-throughput mass transfer of electronic die.

BACKGROUND

Light emitter devices, which include light emitting devices ("LEDs"), are solid state devices that convert electrical energy into light. LEDs can be utilized in light emitter devices or components for providing different colors and patterns of light useful in various lighting and optoelectronic applications. One such application is the use of LEDs in video screens. LED video displays typically comprise arrays of red, green, and blue LEDs mounted on a single electronic device attached to a printed circuit board (PCB) that controls the output of each electronic device.

Conventional LED arrays often have a transparent encapsulant covering the individual LEDs to protect the devices and maximize the efficiency of the devices. When used in applications such as video screens, it may be additionally desirable to reduce and/or enhance the amount of reflected light. Controlling the amount of reflected light can provide benefits such as increased contrast, image sharpness, and consistent color quality across viewing angles.

Additionally, LED devices, such as video screens, continue to increase in size and resolution (e.g., pixel density), while the size of the individual components making up these devices has been decreasing. Accordingly, the time and complexity required to construct these higher resolution devices has necessarily been increasing. In fact, with so-called "8K" displays, which have a resolution of 7680×4320 pixels (e.g., 33,177,600 individual pixels), beginning to gain a foothold in the marketplace, the use of LED (e.g., so-called mini or micro LED) technology to create each of the pixels would require the placement of individual LED components to create the more than 33 million individual pixels via a die attach process. In fact, some such displays require, in order to produce accurate color rendering, three separate LEDs that are each individually controllable for each pixel. In such instances, the three LEDs will comprise a first LED to produce a red-tinted light, a second LED to produce a green-tinted light, and a third LED to produce a blue-tinted light. As such, it may, in some instances, be required for approximately 100 million LEDs to be placed in order to create even a single 8K video display using such mini-LED or micro-LED technology.

Typical mechanical die attach machines can cost approximately $150,000 or more and process only a single light emitter at a time, such devices being capable of processing approximately 3,000 light emitter devices per hour. Not only does the cost of such machines add significantly to the cost of such an 8K display, but the relatively low throughput renders the creation of even a single 8K display impractical. In fact, it would take such a conventional mechanical die attach machine approximately 460 days of continuous, uninterrupted operation to manufacture a single 8K LED display device; this is obviously not economically viable over a long time frame, where cost is expected to be dramatically reduced over time. There are other direct attach tools that have recently become commercially available that are capable of processing approximately 20,000 light emitter device per hour, but the problem of excessively long processing time to manufacture even a single 8K display remains, with such higher throughput machines being capable of producing a single 8K LED display approximately every 69 days, assuming continuous and uninterrupted operation during this time span. As such, a need exists to improve the speed of LED component placement in such high resolution display devices, while maintaining desired light output features and controlling costs.

SUMMARY

In accordance with this disclosure, apparatuses for transferring electronic components onto a substrate or superstrate, as well as corresponding methods of transferring electronic components onto a substrate or superstrate, are provided.

In some aspects, an apparatus for transfer of electronic components onto a substrate or superstrate is provided. The apparatus comprises: a receiving structure; and an ejector assembly. The ejector assembly is configured to remove a subset of a plurality of electronic components from a die sheet by pressing the individual electronic component against the receiving structure to form a predefined pattern of electronic components thereon, the predefined pattern of electronic components comprising a portion of the plurality of electronic components transferred from the die sheet to the receiving structure.

In some aspects, an apparatus for transfer of electronic components onto a substrate or superstrate is provided. The apparatus comprises: a receiving structure; an ejector assembly arranged on adjacent to the receiving structure, wherein the ejector assembly is configured to remove a subset of a plurality of electronic components from a die sheet by pressing the individual electronic component against the receiving structure to form a predefined pattern of electronic components thereon, the predefined pattern of electronic components comprising a portion of the plurality of electronic components transferred from the die sheet to the receiving structure; and a first press element. The superstrate is arranged so that the adhesive layer faces the receiving structure and the system is configured to apply, using at least the first press element, a compressive force to press the portion of the plurality of electronic components on the receiving structure against the adhesive layer to attach the portion of the plurality of electronic components to the superstrate. In some such aspects, the apparatus comprises a second press element arranged adjacent to the superstrate, opposite the receiving structure, and the first press element is arranged adjacent to the receiving structure, opposite the superstrate, and the second press element is configured, along with the first press element, to apply the compressive force to press the portion of the plurality of electronic components on the receiving structure against the adhesive layer to attach the portion of the plurality of electronic components to the superstrate.

In some aspects, a method of transferring electronic components onto a substrate or superstrate is provided. The method comprises: positioning an ejector assembly under an individual or subset of a plurality of electronic components on a die sheet; positioning an adhesive receiving structure at a predetermined position for forming a predefined pattern of electronic components on the receiving structure; actuating the ejector assembly; and transferring the individual or subset of the plurality of electronic components from the die sheet onto the receiving structure at the predetermined position.

In some aspects, a method of transferring electronic components onto a substrate comprising a superstrate and an adhesive layer formed on at least a first side of the superstrate is provided, the method comprising: positioning an ejector assembly under an individual or subset of a plurality of electronic components on a die sheet; positioning an adhesive receiving structure at a predetermined position for forming a predefined pattern of electronic components on the receiving structure; actuating the ejector assembly; transferring the individual or subset of the plurality of electronic components from the die sheet onto the receiving structure at the predetermined position; moving the receiving structure between a first press element and the superstrate; applying, using at least the first press element, a compressive force to press the portion of the plurality of electronic components on the receiving structure against the adhesive layer to attach the portion of the plurality of electronic components to the superstrate; and transferring the individual or subset of the plurality of electronic components from the receiving structure onto the superstrate, wherein the superstrate is arranged so that the first side thereof faces a first side of the receiving structure. In some such aspects, the first press element is arranged adjacent to the receiving structure, opposite the superstrate, the method comprises arranging a second press element adjacent to the superstrate, opposite the receiving structure, and the compressive force is applied using the first and second press elements.

In some aspects, a method of transferring electronic components onto a substrate comprising a superstrate and an adhesive layer formed on at least a first side of the superstrate is provided. The method comprises: transporting a receiving portion of an adhesive receiving structure to a first transfer apparatus; positioning a first ejector assembly under an individual or a subset of a plurality of first electronic components on a first die sheet, wherein the first electronic components are configured to emit a green light; positioning the receiving portion of the receiving structure at a first predetermined position for forming a predefined pattern of first electronic components on the receiving portion of the receiving structure; actuating the first ejector assembly; transferring the individual or subset of the plurality of first electronic components from the first die sheet onto the receiving structure at the first predetermined position; transporting the receiving portion of the receiving structure to a second transfer apparatus; positioning a second ejector assembly under an individual or a subset of a plurality of second electronic components on a second die sheet, wherein the second electronic components are configured to emit a red light; positioning the receiving portion of the receiving structure at a second predetermined position for forming a predefined pattern of second electronic components on the receiving portion of the receiving structure; actuating the second ejector assembly; transferring the individual or the subset of the plurality of second electronic components from the second die sheet onto the receiving structure at the second predetermined position to create a plurality of first and second electronic components on the receiving structure; transporting the receiving portion of the receiving structure to a third transfer apparatus; positioning a third ejector assembly underneath an individual or a subset of a plurality of third electronic components on a third die sheet, wherein the third electronic components are configured to emit a blue light; positioning the receiving portion of the receiving structure at a third predetermined position for forming a predefined pattern of third electronic components on the receiving portion of the receiving structure; actuating the third ejector assembly; transferring the individual or the subset of the plurality of third electronic components from the third die sheet onto the receiving structure at the third predetermined position to create a plurality of first, second, and third electronic components; transporting the receiving portion of the receiving structure to a placement apparatus; and moving the receiving portion of the receiving structure through a gap between a superstrate and a pressing element to apply a compressive force to press the plurality of first, second, and third electronic components on the receiving structure against the adhesive layer of the superstrate to attach the plurality of first, second, and third electronic components to the superstrate. The superstrate is arranged so that the adhesive layer faces the receiving structure.

In some aspects, a light emitter panel is provided, such light emitter panel being produced according to a method of transferring electronic components onto a substrate comprising a superstrate and an adhesive layer formed on at least a first side of the superstrate. In such aspects, the method comprises: positioning an ejector assembly under an individual or subset of a plurality of electronic components on a die sheet; positioning an adhesive receiving structure at a predetermined position for forming a predefined pattern of electronic components on the receiving structure; actuating the ejector assembly; transferring the individual or subset of the plurality of electronic components from the die sheet onto the receiving structure at the predetermined position; moving the receiving structure between a first press element and the superstrate; applying, using at least the first press element, a compressive force to press the portion of the plurality of electronic components on the receiving structure against the adhesive layer to attach the portion of the plurality of electronic components to the superstrate; and transferring the individual or subset of the plurality of electronic components from the receiving structure onto the superstrate. In such aspects, the superstrate is arranged so that the first side thereof faces a first side of the receiving structure.

In some aspects, a light emitter panel is provided, the light emitter panel comprising: a substrate comprising a superstrate and an adhesive layer formed on at least a first side of the superstrate; and a plurality of electronic components attached to the superstrate in at least one predefined pattern from an adhesive receiving structure, on which the individual or groups of electronic components are temporarily attached in the predefined pattern, the individual or groups of electronics components having been transferred from a die sheet to the adhesive receiving structure in the predefined pattern by an ejector assembly.

BRIEF DESCRIPTION OF THE DRAWINGS

A full and enabling disclosure of the present subject matter is set forth more particularly in the remainder of the specification, including reference to the accompanying, example figures relating to one or more example embodiments, in which:

FIGS. 4A-4C are respective cross-sectional views showing the transfer of a plurality of electronic dies from a receiving structure, as shown in any of the example embodiments of FIGS. 1-3, onto a substrate or superstrate, in accordance with the disclosure herein;

DETAILED DESCRIPTION

Figure 1:
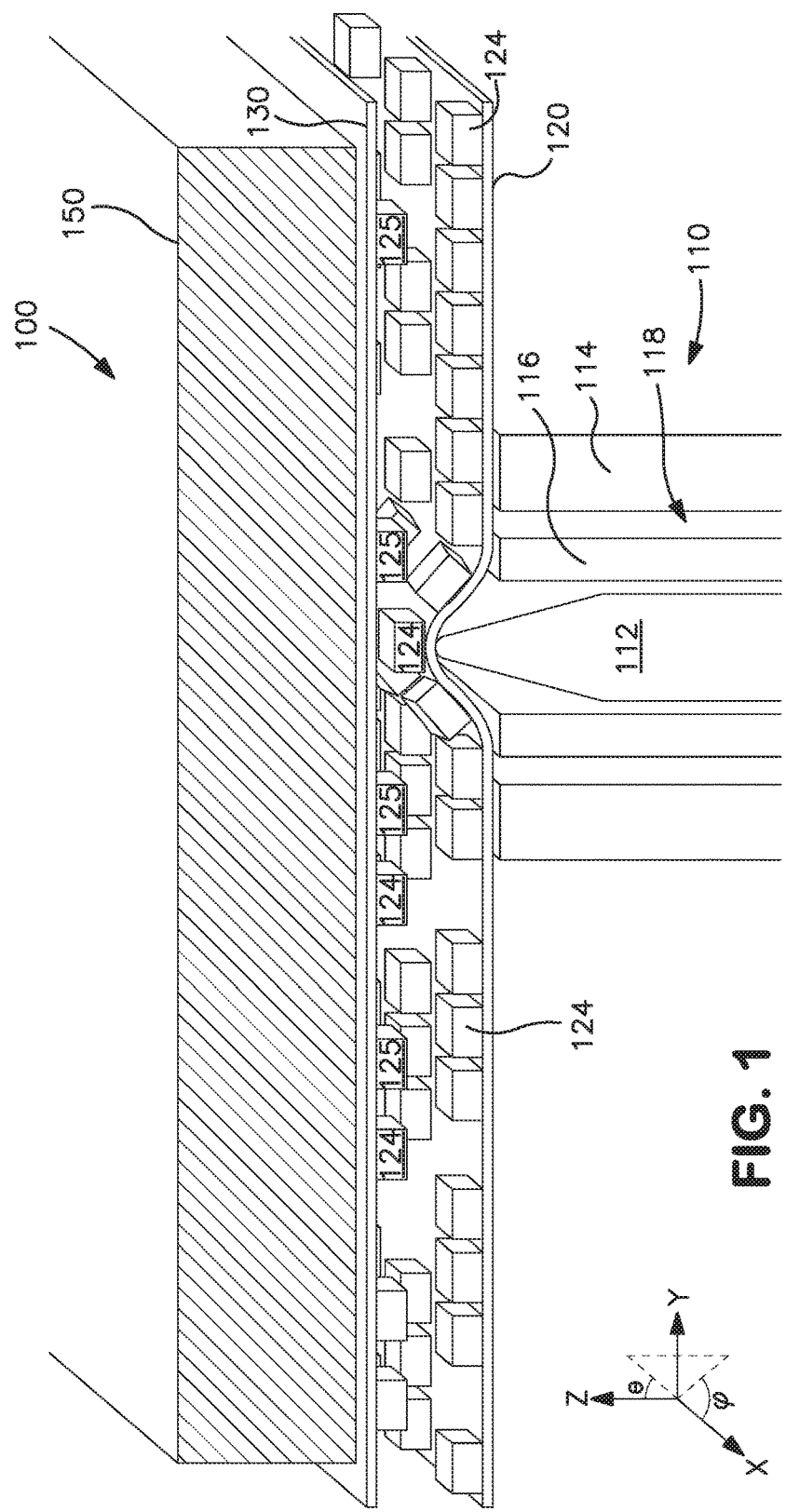
FIG. 1 is a sectional perspective side view of a first example embodiment of a transfer device for applying a plurality of electronic dies to a receiving structure, in accordance with the disclosure herein.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, glass, plastic, transparent substrates, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible, a transparent conductor, such as indium tin oxide (ITO), and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can in some aspects comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover or partially cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to embodiments of LED structures having a light source that comprises LEDs. The LED packages can be arranged in different ways and are relatively small, while at the same time are efficient, reliable and cost effective. The embodiments according to the disclosure herein can have different shaped encapsulants, and can emit light with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described with reference to example embodiments, but it is understood that the disclosure herein can be embodied in many different forms and should not be construed as limited to the embodiments set forth herein. In particular, the disclosure herein is described below in regards to certain LED apparatuses having LEDs in different configurations, but it is understood that the disclosure herein can be used for many other LED packages with other LED configurations. LED packages using the disclosure herein can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A gap between the LEDs and on the common substrate can extend to certain layers or can extend all the way to or from the common substrate. Therefore, a monolithic LED can comprise more than one LED junctions on a common substrate, and the gaps between the LEDs can be formed to at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

Coatings, encapsulants, encapsulant layers, and the like are disclosed herein and can comprise any material that provides mechanical, chemical, and/or environmental protection to a substrate, reflective layer, or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Coating materials disclosed herein can in some aspects comprise a number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester, metal, etc.

Referring to the figures, one approach to increasing the speed of manufacture is to substantially simultaneously assemble a plurality of electronic components onto a single substrate, which may also be described by those having ordinary skill in the art as a "superstrate." This can be particularly useful when creating multi-color light emitter device arrays for use in high-resolution (e.g., high-density, or "HD") video displays. In some instances, one or more light emitter devices can be attached to one of a plurality of adhesive receiving structures (e.g., "intermediate" structures), each of which is sequentially applied to a superstrate to apply a plurality of patterns of light emitter devices thereto. One of the advantages of such an embodiment would allow for the manufacturing of an array of light emitter devices on a single superstrate from a plurality of sub-patterns applied to respective ones of a plurality of adhesive receiving structures, which can be manufactured in parallel (e.g., simultaneously, with a separate machine being used to adhesively apply a plurality of light emitter devices to each of a plurality of adhesive receiving structures).

Additionally, it is advantageous to streamlining the manufacturing process and improve light quality, as well as quantity. For example, the device and method disclosed herein can be implemented such that light emitter devices can be assembled without the use of a traditional substrate. This can be accomplished by assembling the LEDs topside-down, such that the light-emitting surface of each light emitter device is adhesively attached to an at least partially transparent superstrate, which can be designated as an outer surface in the finished product. The light emitter devices, after being sufficiently affixed to the superstrate, can then be connected (e.g., electrically, for provision of voltage and current) by applying electrical traces to the exposed metal connection points (e.g., electrical contacts) on the opposite side.

Figure 2:
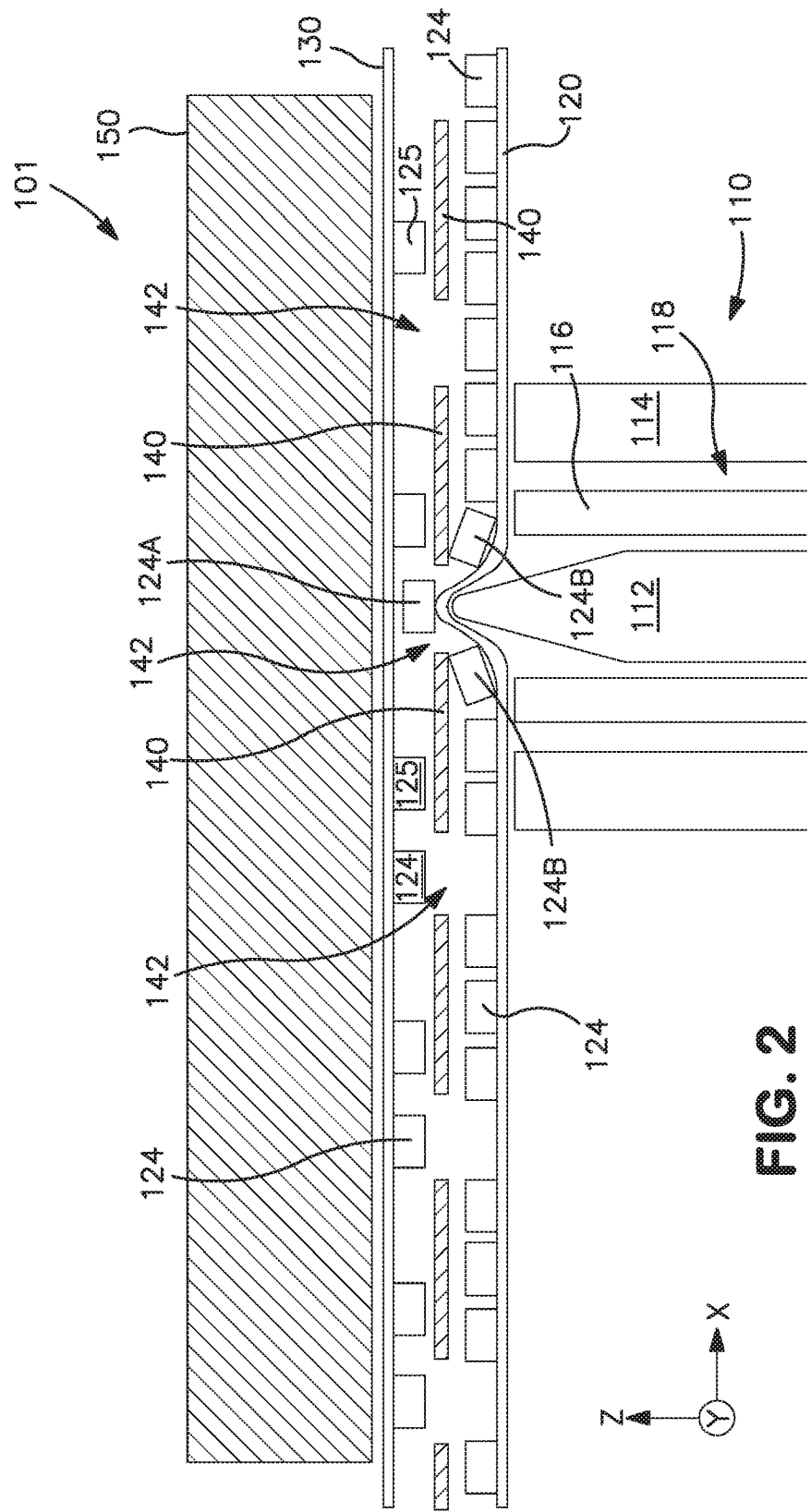
FIG. 2 is a cross-sectional view of a second example embodiment of a mass transfer device for applying a plurality of electronic dies to a receiving structure, in accordance with the disclosure herein.
Figure 3:
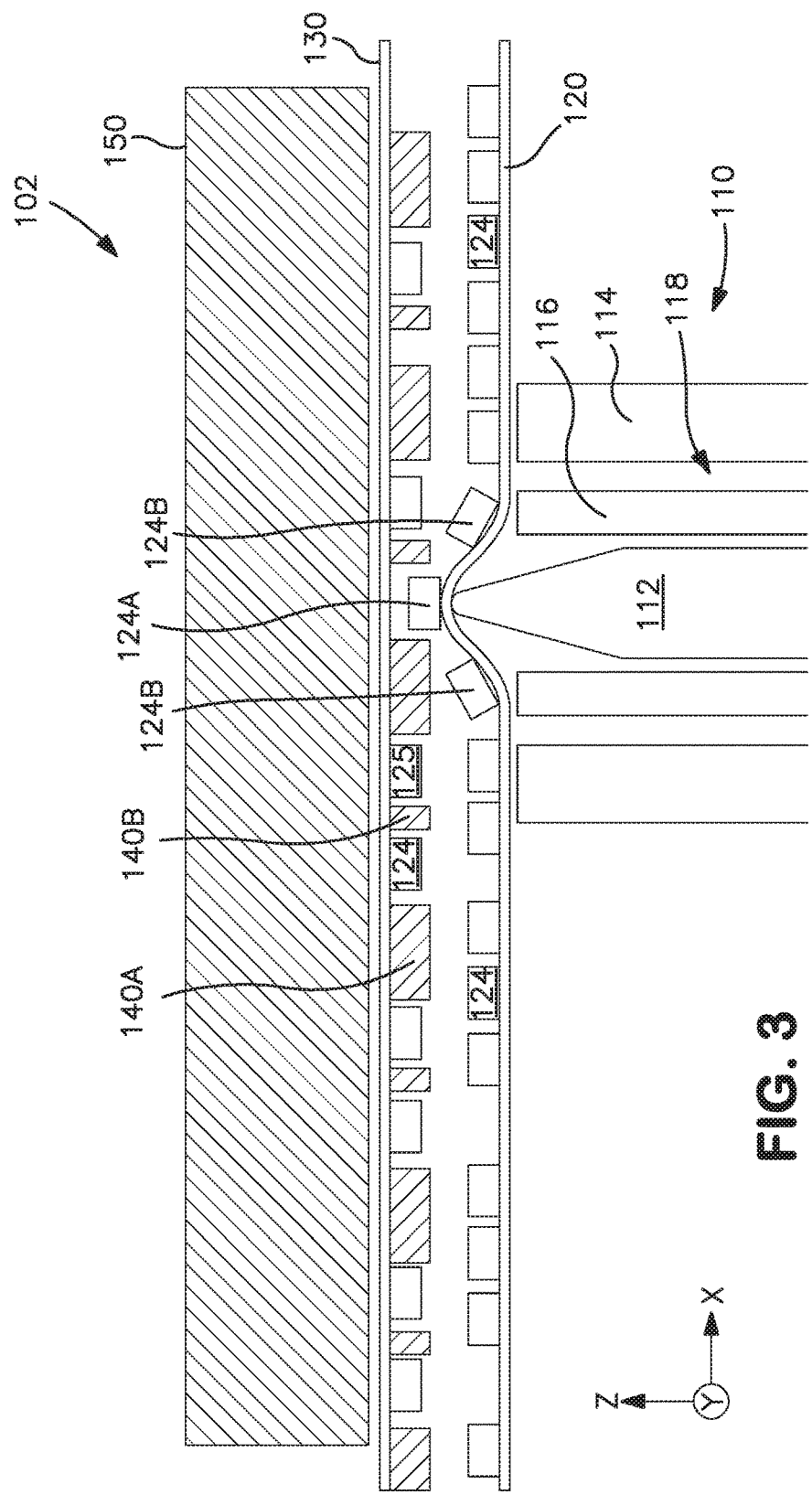
FIG. 3 is a cross-sectional view of a third example embodiment of a mass transfer device for applying a plurality of electronic dies to a receiving structure, in accordance with the disclosure herein.

Referring to FIGS. 1-3, first, second, and third example embodiments of a mass transfer apparatus, generally designated 100, 101, and 102, respectively, for a plurality of electronic dies (e.g., light emitter devices) are shown, respectively. FIGS. 1-3 describe apparatuses and methods for high speed die placement and arrangement of electronic components (e.g., 124, 125) on a receiving structure (e.g., 130). In some embodiments, receiving structure 130 comprises a part of the final component being manufactured. In some other embodiments, receiving structure 130 is used as a temporary structure for the arranging/placing of the electronic components for subsequent transfer en masse onto a final substrate or superstrate. The common aspects of the example embodiments of FIGS. 1-3 will be described hereinbelow referring to each of FIGS. 1-3, while the differences in the features therebetween will be discussed separately with respect to each respective figure. As shown in each of FIGS. 1-3, a plurality of light emitter devices 124 (hereinafter, "LEDs") are shown being positioned on (e.g., with a light adhesive or other mechanical retention features) a die sheet 120. LEDs 124 can comprise one or more discrete light emitter chips thereon so that each LED 124 can be configured to produce a tunable light output color. In some embodiments, each LED 124 can be any suitable individual electronic component. While the views of each of FIGS. 2-5 are respective cross-sectional views with only a single row of LEDs 124 visible, the LEDs 124 are, in some embodiments, arranged in a two-dimensional array of electronic components extending into and/or out of the plane of view from which the respective cross-sectional views of FIGS. 2-5 are taken. An ejector assembly, generally designated 110, is arranged underneath the bottom surface of the die sheet 120. While the ejector assembly 110 is shown as being vertically beneath the die sheet 120 in each of FIGS. 1-3, as this arrangement minimizes the need to provide positive mechanical retention between the LEDs 124 and the die sheet 120, the ejector assembly and die sheet can be operated in any orientation relative to the force of gravity (e.g., at or about 90° or at or about 180° from the orientation shown in FIGS. 1-3).

In some embodiments, the die sheet 120 comprises a two-dimensional matrix of LEDs 124 that can be, for example, picked and/or sorted onto/from a substrate of the die sheet 120. In some other embodiments, the die sheet 120 comprises a stretched wafer (substrate) with LEDs 124 placed therein. In some embodiments, the die sheet 120 can be a singulated and stretched wafer. In such embodiments where the die sheet 120 comprises a stretched wafer, due to the inherently non-uniform spacing of the LEDs 124 on the die sheet 120 induced by the stretching, it is generally not possible to account for such non-uniform positional differences with conventional two-dimensional pitch offset settings. As such, to account for the non-uniform distribution of the LEDs 124 caused by the stretching of the die sheet 120 in such embodiments, a "wafer map" containing the precise locations of each LED 124 in the respective stretched positions may be generated by scanning the surface of the stretched wafer and merging the data generated with probe data to ensure that only "good" LEDs 124 are positioned over the ejector assembly 110 for transfer onto the receiving structure 130.

An adhesive receiving structure 130 (e.g., a carrier, tape, or an adhesive material disposed on a surface of any suitable substrate) is located vertically above (e.g., in a direction orthogonal to the direction of extension of the line of LEDs 124 visible in FIGS. 1-3) the LEDs 124 and the die sheet 120. As shown in FIGS. 1-3, a plurality of LEDs 124 are already adhesively attached to the receiving structure 130, with gaps present between one or more of the LEDs 124. In the embodiment shown, the LEDs 124 already attached to the receiving structure 130 comprise at least a portion of a predefined pattern of electronic components (e.g., LEDs 124) that is to be formed on the receiving structure 130 and subsequently transferred to a substrate/superstrate (see, e.g., FIGS. 4A-4C). Other elements 125 are shown as having already been placed on the receiving structure 130 during a separate (e.g., prior) operation. Elements 125 may be LEDs of different color or other electronic devices. In forming the predefined pattern of electronic components, an individual LED 124 on the die sheet 120 is aligned with a predetermined position on the receiving structure 130 that corresponds with a point on the predefined pattern of electronic components. Next, the individual LED 124 is pressed against the receiving structure 130 at the predetermined position.

A plurality of ejector assemblies 110 can be used to reduce processing times by applying multiple LEDs 124 (e.g., from a same die sheet 120 or from a plurality of die sheets 120) to the receiving structure 130 substantially simultaneously (e.g., in a continuous fashion). The predefined pattern is stored in the memory of a computer and/or database, and a controller is configured to move one or more of the die sheet 120, the receiving structure 130, and the ejector assembly to position a desired LED 124 on the die sheet 120 between a designated position on the receiving structure 130, which corresponds to one of a plurality of positions on which an LED 124 must be placed to create the predefined pattern, and the ejector assembly 110 so that the ejector assembly 110 can be used to press the desired LED 124 against the receiving structure 130 at the designated position specified by the controller. The computer and/or database can store a plurality of predefined patterns, each of which may be different. Furthermore, the die sheet 120 and the receiving structure 130 can be a same or a different size (e.g., in the x-y plane) as each other and the pitch of the LEDs 124 on the die sheet 120 can be the same as or different from the pitch specified by the pattern of LEDs.

For clarity, the LEDs 124 that are not in the row of LEDs 124 through which the cross-sectional view is taken are not shown in FIG. 1, since the illustration of such out-of-plane LEDs 124 would be difficult to distinguish from those LEDs 124 that are in the row through which the cross-sectional view is taken.

A backing support 150 may be located behind (e.g., above, as shown in FIGS. 1-3) the receiving structure 130 to provide a mechanical support preventing significant movement away from the die sheet 120 as one or more LEDs 124 are pressed onto the surface (e.g., the bottom surface, or the surface of the receiving structure 130 facing the die sheet 120) of the receiving structure 130 by actuation of the ejector assembly 110. Backing support 150 can comprise any sufficiently rigid material, including, for example, glass, ceramic, plastic, composite materials, metals, and the like. While gaps are shown being present between the die sheet 120 and the components of the ejector assembly 110, as well as between backing support 150 and receiving structure 130, these gaps are merely illustrative to easily show the relative arrangements of the components of the apparatus and may not be present at all times during operation of the apparatus (e.g., the die sheet 120 may be drawn against the ejector assembly by the vacuum and the receiving structure 130 may be pressed against the backing support 150 when LED 124 is transferred from the die sheet 120 to the receiving structure 130). In some embodiments, the receiving structure 130 and the backing support 150 may be mechanically attached to each other (e.g., integrally) and, in some embodiments, the receiving structure 130 and the backing support 150 may have a curved shape.

In some embodiments (see, e.g., FIG. 5), a plurality of backing supports with a curved shape are provided. These curved shapes may be circular, such that the receiving structure comprises a substantially uninterrupted adhesive surface with a length substantially equivalent to the circumference of the circular cross-section of the curved shape of the receiving structure 130. In some such circular embodiments, the receiving structure 130 may be wrapped conformally around a cylindrical backing support 150 and can be either integrally formed as part of the cylindrical backing support 150 or separate and removable therefrom.

Ejector assembly 110 has an ejector pin 112 that is surrounded (e.g., circumferentially) by a vacuum chamber 118, or other suitable vacuum generator, that is configured to apply a vacuum to the underside of the die sheet 120, around a perimeter of the ejector pin 112, to cause a localized deformation of the die sheet 120 to prevent an inadvertent attachment of LEDs 124 (e.g., electronic components), which are adjacent to the single LED 124 on the die sheet 120, to the receiving structure 130. Through this localized deformation, the adjacent LEDs 124 remain spaced apart from the receiving structure 130 whilst a single LED 124 (e.g., an individual electronic component) is pressed upwards (e.g., out of the plane of the die sheet 120 when in an undeformed state) by the ejector pin 112 so that the lower surface (e.g., the surface with the electrical contacts formed thereon) of the single LED 124 being actuated is mechanically bonded (e.g., by an adhesive) to the receiving structure 130 without the adjacent LEDs 124 that are not immediately underneath the ejector pin 112 physically contacting the receiving structure 130 and being inadvertently adhered thereto. In essence, the vacuum chamber 118 is configured to generate and/or maintain a vacuum between an inner member 116 and an outer member 114 to apply a suction force to the bottom (e.g., adjacent) surface of the die sheet 120, opposite a top side thereof, so that the deformations of the die sheet 120 caused by protrusion of the ejector pin 112 are localized to only be induced within the area of the die sheet 120 that is internal to the vacuum chamber 118. In some embodiments, other support elements, such as, for example, x-y-z positioners, vacuum pumps, valves, control elements, and the like may be provided.

In some embodiments, ejector assembly 110 comprises a plurality of ejector pins 112 that are configured to be individually or uniformly controlled and/or actuated. In such embodiments, it is advantageous for a pitch (e.g., spacing) of adjacent ejector pins 112 to be the same as the pitch of adjacent LEDs 124 to allow for the ejection of multiple LEDs 124 substantially simultaneously, for example, upon an actuation signal being sent to the ejector assembly 110 so that each ejector pin 112 is fully actuated and retracted before any other ejector pin 112 of the same ejector assembly 110 is actuated again. A wafer map of the die sheet 120 would allow for an ejector assembly 110 with multiple such ejector pins 112 to work so that only ejections over groupings of multiple LEDs 124 that are all identified as "good" (e.g., no flaws identified during a quality assurance inspection) are enabled onto the receiving structure 130 as a first step of a transfer process. In some embodiments, SDS (sorted die sheets) may be used, so that only "good" LEDs 124 are presented to the ejector assembly. In such embodiments, two-dimensional arrays may be produced to match a number of the multiple ejector pins 112 of the ejector assembly 110 so that all ejections are viable (e.g., no "bad" LEDs are transferred). In a related embodiment, it is envisioned to pre-pick a stretched wafer to remove all "bad" LEDs 124 from the die sheet 120 and then use a large array of precision-spaced ejector pins populate the superstrate. In some embodiments, an inspection of the receiving structure 130 could be made after multiple-ejection population of LEDs 124 from a pre-picked wafer (die sheet 120) and single LEDs 124 could be ejected using an inspection map to fill in missing sites on the receiving structure 130. In another embodiment, the ejector assembly is a smart-multiple-ejection system, which only actuated ejector pins 112 under "good" LEDs 124 and couples with movement of the receiving structure 130 to make sure that all sites designated in a predefined pattern are populated with "good" LEDs 124. In such embodiments, a wafer map is used for the smart ejection and a "superstrate map" of the receiving structure 130 is generated as the receiving structure 130 moves relative to the die sheet 120 to guarantee that all designated sites on the receiving structure 130 are populated. In some embodiments, it is advantageous for the receiving structure 130 to be populated according to the predefined pattern in a substantially sequential manner. In this context, "substantially sequential" means that all positions of the predefined pattern on the receiving structure 130 that are adjacent to "good" LEDs 124 on the die sheet 120 are populated (e.g., in an "S" pattern) before other positions are populated, as might be the case if transfer of the LEDs 124 onto the receiving structure 130 were performed randomly in a scattershot pattern. However, "substantially sequential" placement would allow for positions located adjacent to "bad" LEDs 124 to be skipped and to be placed at a later time, as necessary.

Still referring generally to the example embodiments of FIGS. 1-3, one or more (e.g., all) of the die sheet 120 (and the LEDs 124 arranged thereon), the receiving structure 130 (and the LEDs 124 arranged thereon), and the ejector assembly 110 are configured to be moved (e.g., movable) independently of each other in one or more directions (e.g., in an x-direction as shown in the cross-sectional view of FIGS. 1-3, in a y-direction orthogonal to the plane in which the cross-sectional view is taken, and/or in a vertical z-direction independent of each other). As such, if a particular LED 124 of the array of LEDs 124 on the die sheet 120 needs to be placed in a given (e.g., first) position on the receiving structure 130, then the receiving structure 130, the die sheet 120, and/or the ejector assembly 110 may move in the x-y plane to position the desired LED 124 on the die sheet 120 directly underneath the given position on the receiving structure 130. The ability for the die sheet 120, the receiving structure 130, and the ejector assembly 110 to move independently of each other allows for faster transit times and a higher throughput volume of LEDs 124 placed on the receiving structure 130 than if one or a plurality of the die sheet 120, the receiving structure 130, and the ejector assembly 110 are statically fixed in position. In some embodiments, optical sensors (e.g., video capture devices), controllers, and the like may be used to aid in achieving precise and accurate alignment of the components of the apparatus relative to each other.

Referring specifically to the example embodiment shown in FIG. 2, a mask 140 is disposed vertically above the LEDs 124 on the die sheet 120 and vertically below the upper surfaces (e.g., the primary light emitting surface) of the LEDs 124 that have already been deposited onto receiving structure 130. In the embodiment shown in FIG. 2, the mask 140 is disposed at a vertically elevated position relative to the lower surfaces, such as the electrical contact surfaces, of the LEDs 124. As such, mask 140 acts as a physical barrier between the die sheet 120 and the receiving structure 130, as well as the respective LEDs 124 attached thereto. Mask 140 has one or more (e.g., a plurality of) gaps, generally designated 142, that are formed in (e.g., in the x-y plane) and through the thickness (e.g., in the z-direction) of mask 140. Just as was shown in FIG. 1, ejector pin 112 actuates and pushes a designated LED 124A against the receiving structure at a predetermined position through one of the one or more gaps 142. The die sheet 120 is made of a deformable material and, in some embodiments, is resilient and will return to an original shape after undergoing some prescribed maximum amount of deformation. Just as is described herein with respect to the ejector assembly 110, the die sheet 120, and the receiving structure 130, the mask is, in some embodiments, capable of being moved in one or more of the x-direction, the y-direction, the z-direction, the φ-direction, and/or the ψ-direction.

Due to the location of the mask 140 surrounding the gap 142 through which LED 124A is pressed by the ejector pin 112, the adjacent LEDs 124B adjacent to LED 124A will contact mask 140 to prevent excessive deflection of the adjacent LEDs 124B towards receiving structure 130, avoiding the risk of excessive deflection of adjacent LEDs 124B that would otherwise result in adhesion of the adjacent LEDs 124B against the receiving structure 130. As such, because the vertical displacement of adjacent LEDs 124B is constrained by contacting the mask 140, the deformation of die sheet 120 underneath LED 124A is much sharper in comparison to that shown in FIG. 1, where no mask is present. This acute bending of the die sheet 120 underneath LED 124A has the benefit of reducing the contact area between LED 124A and die sheet 120 when the ejector pin 112 is actuated. This reduced contact area reduces the retention force between the die sheet 120 and the LED 124A, thereby requiring comparatively lower adhesive force to remove the LED 124A from the die sheet 120, and also aids in preventing thicker LEDs on the die sheet 120 from interacting with the electrical components (e.g., 124, 125) already placed on the receiving structure 130.

Referring specifically to the third example embodiment of the apparatus shown in FIG. 3, the mask, generally designated 140, is similar in function to that shown and described relative to the embodiment of FIG. 2, but the mask 140 comprises a plurality of portions having different dimensions, with first portion 140A having a width, length, and/or thickness that is different from second portion 140B. The mask 140 in this embodiment is in contact with the exposed surface of receiving structure 130. In some embodiments, the mask 140 may be adhesively attached to, or integrally formed with, the receiving structure 130. The mask 140 prevents physical contact between adjacent LEDs 124B and the receiving structure when the ejector pin 112 is actuated to press LED 124A against the receiving structure 130, thereby preventing unintended adhesion between the adjacent LEDs 124B and the receiving structure 130 during normal operation. It is a further advantage that the die sheet 120, the receiving structure 130, and/or the ejector assembly 110 may begin a translatory movement to a subsequent position where a subsequent one of the plurality of LEDs 124 will be attached to the receiving structure 130, because the adjacent LEDs 124B will be spaced apart from already placed LEDs on the receiving structure 130 without contacting such already-placed LEDs 124 during the translatory movement. This allows for a higher throughput of parts and a higher volume of light emitter devices being processed by a given apparatus. In embodiments where the receiving structure 130 is to be used for temporarily staging LEDs 124 and other elements 125 that are to be transferred en masse to a final substrate, such as shown in FIG. 3 where the mask 140 is taller than a height of the LEDs 124, it is generally advantageous for the mask 140 to be removed from the receiving structure 130 before the LEDs 124 attached thereto can be deposited onto a superstrate (see, e.g., FIGS. 4A-4C).

Figure 4B:
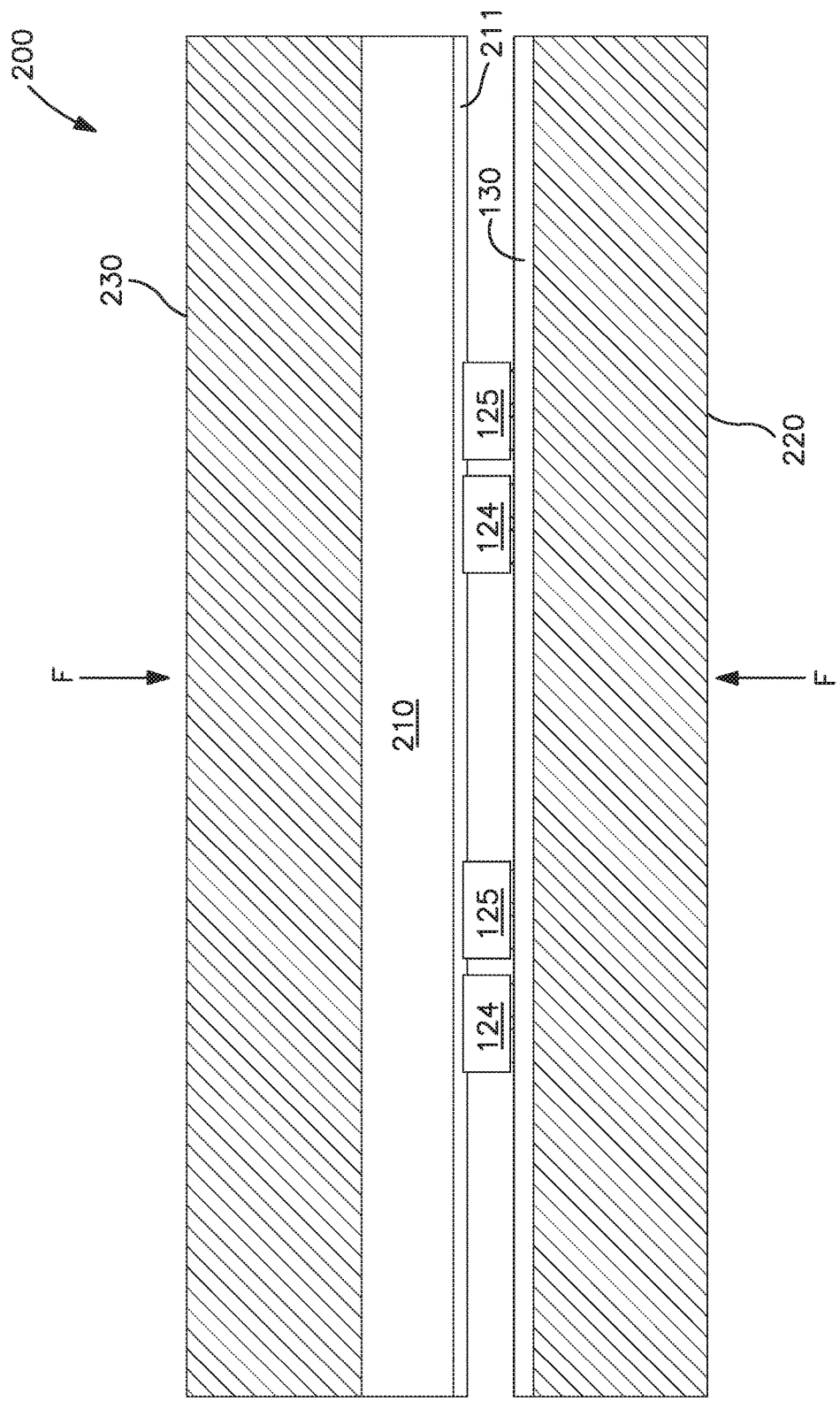

Referring to FIGS. 4A-4C, respective cross-sectional views of a secondary transfer apparatus, generally designated 200, are shown detailing the transfer of a plurality of electronic dies from a receiving structure 130, as shown in any of the example embodiments of FIGS. 1-3. As shown in FIG. 4A, a plurality of LEDs 124 are attached by their lower surfaces, which comprise electrical contacts, generally designated 126, to the receiving structure 130. Superstrate 210 is arranged adjacent to the LEDs 124 on the receiving structure 130, with superstrate 210 being arranged on the same side of the receiving structure 130 on which the LEDs are arranged. The superstrate 210 has an adhesive layer 211 formed on the side of the superstrate 210 facing towards the LEDs 124 and the receiving structure 130. The adhesive layer 211 can be, for example, an uncured layer of a substantially identical material from which the superstrate 210 is formed, such as a b-stage epoxy material. When the adhesive layer 211 is an uncured layer, the adhesive layer 211 is cured after the LEDs 124 are attached thereto. In some other embodiments, the adhesive layer 211 is a separate adhesive layer that is a different material from that of the superstrate. Whether adhesive layer 211 is a curable material or a discrete adhesive material applied to the superstrate 210, it is generally advantageous for the adhesive layer 211 to have equivalent or greater adhesion characteristics to the material used for the receiving structure 130. However, in some embodiments, it is contemplated that adhesive layer 211 may have less adhesion than the receiving structure 130 when the receiving structure 130 is removed from the LEDs 124 after the LEDs 124 are attached to the adhesive layer 211 by, for example, removing the receiving structure 130 with a small radius (e.g., at an acute angle). Stated differently, in some embodiments, the adhesive layer 211 has an equivalent or greater degree of adhesiveness as the receiving structure 130. First and second press elements 220 and 230 are arranged on opposite sides of the assembly defined by the superstrate 210 at the receiving structure 130 with the LEDs 124 attached thereto. First and second press elements 220 and 230 are sufficiently rigid elements that are capable of applying a compressive force to the opposing sides of the receiving structure 130 and the superstrate 210.

As shown in FIG. 4B, a compressive force F is applied to the external surfaces of the first and second press elements 220 and 230 to apply positive pressure to engage the upper surface (e.g., the primary light emitting surface) of each LED 124 against adhesive layer 211. As is shown in FIG. 4B, where adhesive layer is a partially uncured layer of material of the superstrate 210, the LEDs 124 may, depending on the viscosity of the adhesive layer 211 and the magnitude of the compressive force F applied, become partially embedded within the adhesive layer 211, such that the adhesive layer 211 surrounds, at least partially, at least five external surfaces of the LED 124 (e.g., the three surfaces visible in FIG. 4B, as well as the two other lateral sides parallel to the plane in which the cross-sectional view is taken). Because superstrate 210 is, in some embodiments, the surface through which light will be emitted from the display surface, it is advantageous if at least second press element 230 is a material that is softer than that of the superstrate 210 to avoid introducing imperfections (e.g., scratches) in the outer surface of the superstrate 210. In some embodiments where the adhesive layer 211 is a not fully cured epoxy material (e.g., a "b-stage epoxy"), one or both of the first and second press elements 220 and 230 may be configured to heat the adhesive layer 211 until the LEDs are set in the adhesive layer 211, but adhesive layer 211 is only partially cured. In such embodiments, the superstrate 210 with the LEDs 124 attached thereto is transferred to an oven for a final cure stage. In some such embodiments, however, the first and second press elements 220 and 230 may be configured to apply sufficient heat for a duration sufficient to fully cure the adhesive layer 211.

In FIG. 4C, a cross-sectional view corresponding to that shown in FIG. 4B, but after the compressive force F has been applied and the first and second press elements 220 and 230 are spaced apart, respectively, from the receiving structure 130 and the superstrate 210. As shown in FIG. 4C, which shows an arrangement after the receiving structure 130 has been removed from the bottom surface (e.g., the surface with electrical contacts 126 formed thereon) of the LEDs 124, the LEDs 124 remain affixed to the superstrate 210 by adhesive layer 211 thereof. In embodiments where the adhesive layer 211 is a partially uncured layer of superstrate 210, the LEDs 124 may be adhered thereto by the retention forces of surface tension and will be held sufficiently statically in place while the final curing of the adhesive layer 211 is carried out. Furthermore, one or more of the superstrate 210 and the adhesive layer 211 may be a translucent layer and, in some such embodiments, may be tinted with any desired color to provide a shifted light output from one or more of the LEDs 124. In fact, a plurality of zones of the superstrate 210 can be tinted a different color. While in the embodiments shown herein the superstrate 210 is a translucent (e.g., transparent) material, in some embodiments one or more region of the superstrate may be opaque to occlude a direct emission of light from the LEDs 124 attached thereunder. Furthermore, some regions or all of the superstrate 210 may have an opaque material applied thereto to achieve a substantially similar purpose. As shown in FIG. 4C, the electrical contacts 126 of the LEDs 124 are exposed and arranged on an opposite side of LED 124 from the superstrate 210, so that the electrical contacts 126 may be electrically connected with a source. Although first and second press elements 220 and 230 are shown as flat structures, first and second press elements 220 and 230 can be any shape, including cylindrical, which allows for roll-to-roll processing (see FIG. 5).

Figure 5:
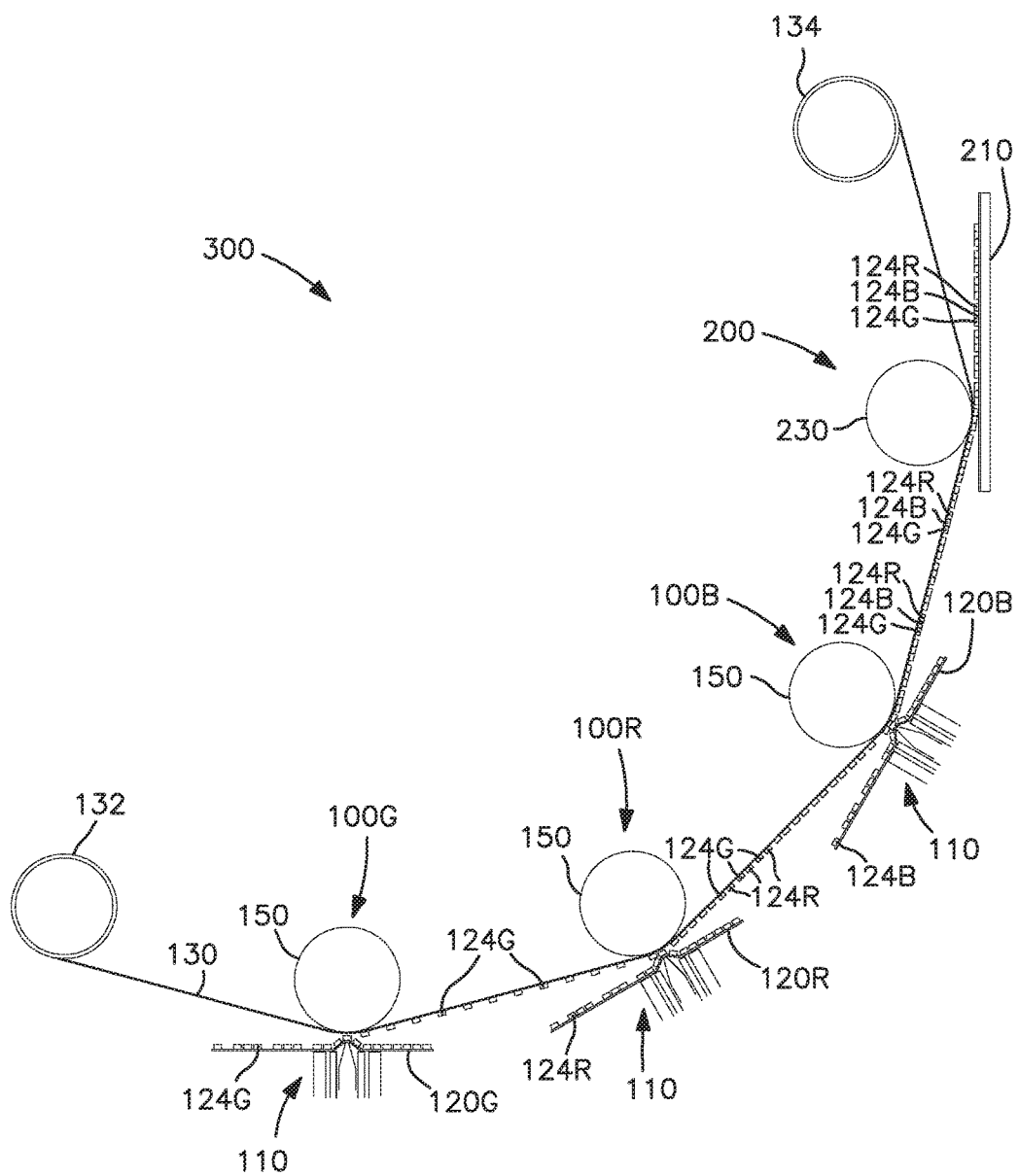
FIG. 5 is a schematic view showing a plurality of stations, at each of which electronic dies are transferred onto a receiving structure and are then transferred en masse onto a substrate or superstrate, in accordance with the disclosure herein.

Referring to FIG. 5, an example embodiment of a system, generally designated 300, for mass transfer of electronic dies onto a substrate or superstrate is illustrated. In this embodiment, three transfer apparatuses, generally designated 100G, 100R, and 100B, are shown. One or more electronic dies are transferred onto a receiving structure 130 at each apparatus. First, second, and third apparatuses 100G, 100R, and 100B are, in the embodiment shown, configured to emit green, red, and blue light, respectively. In some other embodiments, any type of electronic die may be transferred at one or more of the transfer apparatuses 100G, 100R, and 100B onto receiving structure 130. In embodiments, a same electronic die may be transferred onto the receiving structure 130 at each of the transfer apparatuses 100G, 100R, and 100B. Any number of transfer apparatuses may be used. Transfer apparatuses 100G, 100R, and 100B may be of any suitable type and construction, including the embodiments described hereinabove with respect to FIGS. 1-3.

In this embodiment, receiving structure 130 is input from inlet roller 132 and is output to outlet roller 134. Receiving structure 130 may be reusable and formed as a continuously circumferentially uninterrupted ribbon or sheet in some embodiments. In the embodiment shown, receiving structure 130 is fed into system 300 at inlet roller 132. In some embodiments, inlet roller 132 is a supply roll. Receiving structure 130 enters first transfer apparatus 100G and moves between backing support 150 and green die sheet 120G, to be located at a position between ejector assembly 110 and backer support 150. Ejector assembly 110 is actuated and a green LED 124G is transferred onto receiving structure 130 at a position specified by a predetermined pattern of LEDs (e.g., 124G, 124R, and 124B) to be formed on superstrate 200. Ejector assembly 110 and/or green die sheet 120G are independently mobile in the direction of the plane of the green die sheet 120G, so a plurality of green LEDs 124G can be transferred as the receiving structure 130 moves around the circumference of backing support 150 using only a single ejector assembly 110. A plurality of ejector assemblies 110 can be provided at first transfer apparatus 100G so that a plurality of green LEDs 124G can be ejected onto receiving structure 130 substantially simultaneously. This is advantageous where an array of LEDs (e.g., 124G, 124R, 124B) is to be formed on receiving structure 130.

After the green LED(s) 124G are transferred onto receiving structure 130, the receiving structure 130 then travels to the second transfer apparatus 100R and moves between the corresponding backing support 150 and red die sheet 120R thereof, to be located at a position between ejector assembly 110 and backer support 150 of second transfer apparatus 100R. Ejector assembly 110 is actuated and a red LED 124R is transferred onto receiving structure 130 at a position specified by the predetermined pattern of LEDs (e.g., 124G, 124R, and 124B) to be formed on superstrate 200. The position on the receiving structure 130 at which the red LEDs 124R are ejected can be independent from the position of the green LEDs 124G, or can be precisely defined to be adjacent to each of the green LEDs 124G to form a partial RGB (red-green-blue) pixel of a display. Ejector assembly 110 and/or red die sheet 120R are independently mobile in the direction of the plane of the red die sheet 120R, so a plurality of red LEDs 124R can be transferred as the receiving structure 130 moves around the circumference of backing support 150 using only a single ejector assembly 110. A plurality of ejector assemblies 110 can be provided at second transfer apparatus 100R so that a plurality of red LEDs 124R can be ejected onto receiving structure 130 substantially simultaneously. This is advantageous where an array of LEDs (e.g., 124G, 124R, 124B) is to be formed on receiving structure 130.

After the red LED(s) 124R are transferred onto receiving structure 130, the receiving structure 130 then travels to the third transfer apparatus 100B and moves between the corresponding backing support 150 and blue die sheet 120B thereof, to be located at a position between ejector assembly 110 and backer support 150 of third transfer apparatus 100B. Ejector assembly 110 is actuated and a blue LED 124B is transferred onto receiving structure 130 at a position specified by the predetermined pattern of LEDs (e.g., 124G, 124R, and 124B) to be formed on superstrate 200. The position on the receiving structure 130 at which the blue LEDs 124B are ejected can be independent from the position of the green LEDs 124G and/or the red LEDs 124R already transferred onto receiving structure 130 at the first and second transfer apparatuses 100G and 100R, or can be precisely defined to be adjacent to a corresponding pair of green and red LEDs 124G and 124R to form an RGB (red-green-blue) pixel of a display. Ejector assembly 110 and/or blue die sheet 120B are independently mobile in the direction of the plane of the blue die sheet 120B, so a plurality of blue LEDs 124B can be transferred as the receiving structure 130 moves around the circumference of backing support 150 using only a single ejector assembly 110. A plurality of ejector assemblies 110 can be provided at third transfer apparatus 100B so that a plurality of blue LEDs 124B can be ejected onto receiving structure 130 substantially simultaneously. This is advantageous where an array of LEDs (e.g., 124G, 124R, 124B) is to be formed on receiving structure 130.

The plurality of green, red, and blue LEDs 124G, 124R, 124B on receiving structure 130 are then transported to placement apparatus, generally designated 200, the operation of which has already been illustrated and described with respect to FIGS. 4A-4C. At placement apparatus 200, a gap is present between superstrate 210 and press element 230, through which the receiving structure 130 and the LEDs 124G, 124R, and 124B move as the receiving structure 130 moves through the placement apparatus 200 and deposits the LEDs 124G, 124R, and 124B onto the superstrate 210. The height of the gap is less than or equal to the combined vertical height of the receiving structure 130 and the LEDs 124G, 124R, and 124B arranged thereon, to ensure contact between the superstrate 210 and the LEDs 124G, 124R, and 124B. The superstrate 210 is independently mobile from the motion of the receiving structure 130, so that the LEDs 124G, 124R, and 124B can be precisely placed onto superstrate 210 according to the predetermined pattern of LEDs 124G, 124R, and 124B to be formed on superstrate 210. In some embodiments, it is advantageous for the height of the gap to be less than the combined vertical height of the receiving structure 130 and the LEDs 124G, 124R, and 124B arranged thereon, such that the LEDs are embedded, at least partially, within an adhesive layer (see, e.g., 211, FIGS. 4A-4C). When LEDs 124G, 124R, and 124B are engaged with the adhesive layer of the superstrate 210, the LEDs 124G, 124R, and 124B are removed from the receiving structure, which then continues on to exit system 300 at outlet roller 134, around which the receiving structure 130 can be wound for storage and/or disposal or, in embodiments where receiving structure 130 is reusable, redirected to enter system 300 at inlet roller 132.

Still referring to system 300, while the components of system 300 are illustrated schematically, any of the features described in the instant application regarding the embodiments of FIGS. 1-4C may be incorporated into system 300 in any combination.

Figure 6:
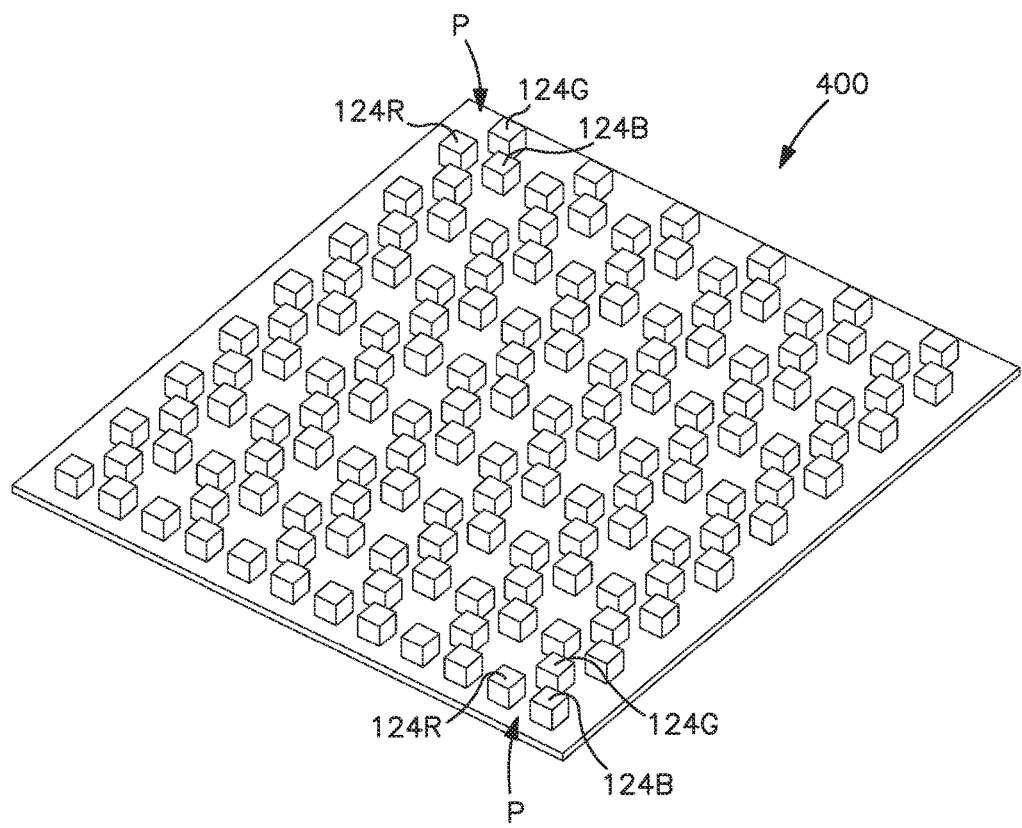
FIG. 6 is an isometric view of an example embodiment of a light emitting device having an array of light emitting pixels attached to a substrate or superstrate, in accordance with the disclosure herein.

Referring to FIG. 6, a portion of a light emitting panel, generally designated 400, is shown. Light emitting panel 400 can be, for example, a display screen. Light emitting panel 400 can be produced according to the transfer apparatuses and methods disclosed in any of FIGS. 1-5 as shown and described hereinabove. In one embodiment, the light emitting panel 400 is produced by a method comprising: positioning an ejector assembly under an individual or subset of a plurality of electronic components on a die sheet; positioning an adhesive receiving structure at a predetermined position for forming a predefined pattern of electronic components on the receiving structure; actuating the ejector assembly; transferring the individual or subset of the plurality of electronic components from the die sheet onto the receiving structure at the predetermined position; moving the receiving structure between a first press element and the superstrate or between first and second press elements; applying, using the first and/or second press elements, a compressive force to press the portion of the plurality of electronic components on the receiving structure against the adhesive layer to attach the portion of the plurality of electronic components to the superstrate; and transferring the individual or subset of the plurality of electronic components from the receiving structure onto the superstrate. In such embodiments, the superstrate is arranged so that the first side thereof faces a first side of the receiving structure.

In the embodiment shown, light emitting panel 400 comprises a two dimensional array of pixels, generally designated P. In the portion of light emitter panel 400 shown in FIG. 6, the array is 8×6, for a total of 48 pixels. Those having ordinary skill in the art will understand that the number of pixels P on the light emitting panel 400 can be scaled to any number, including an amount of pixels P present in 4K and 8K micro- or mini-LED display screens. In the embodiments shown, each pixel P has a green LED 124G, a red LED 124R, and a blue LED 124B. Each of these can be controlled independently to produce substantially any light color output. In some embodiments, one or more of the green LED 124G, a red LED 124R, and a blue LED 124B can be omitted from one or more of the pixels P, based on the pre-defined pattern used to create the array of pixels P on the light emitting panel 400.

Figure 7:
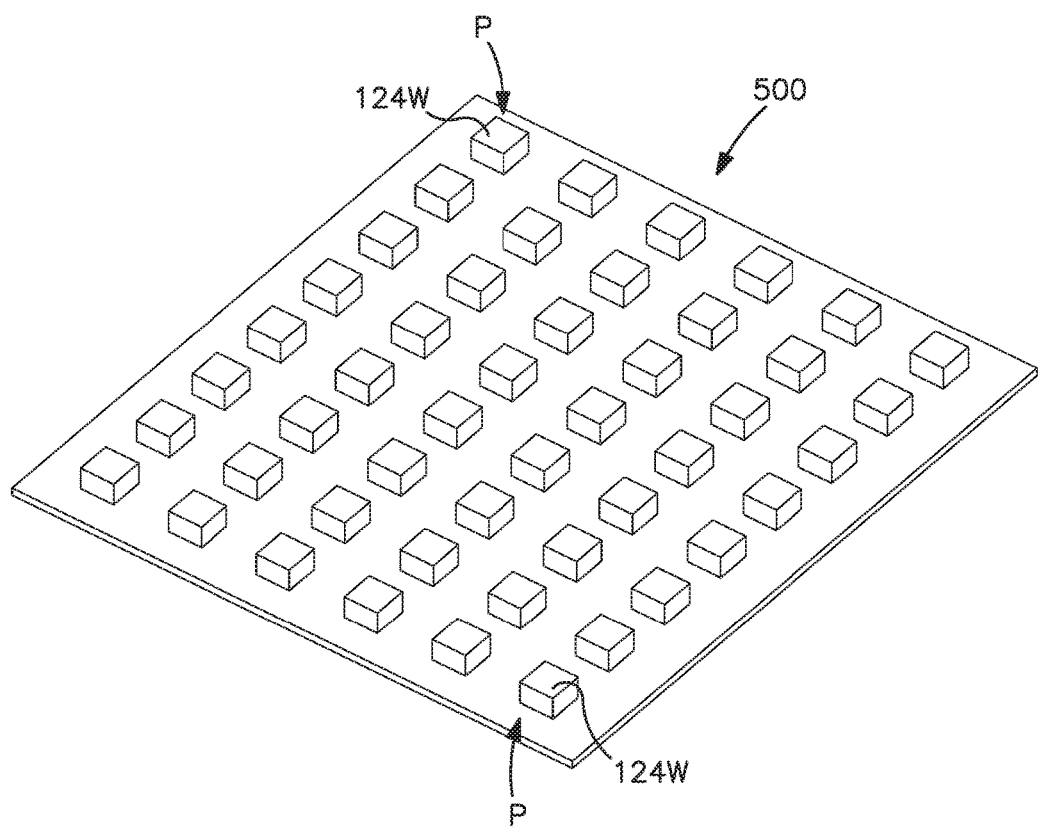
FIG. 7 is an isometric view of an example embodiment of a light emitting device having an array of light emitting pixels attached to a substrate or superstrate, in accordance with the disclosure herein.

Referring to FIG. 7, a portion of a light emitting panel, generally designated 500, is shown. Light emitting panel 500 can be, for example, a backlight device for illuminating a display screen, such as, for example, a liquid crystal display (LCD) screen. Light emitting panel 500 can be produced according to the transfer apparatuses and methods disclosed in any of FIGS. 1-5 as shown and described hereinabove. In one embodiment, the light emitting panel 500 is produced by a method comprising: positioning an ejector assembly under an individual or subset of a plurality of electronic components on a die sheet; positioning an adhesive receiving structure at a predetermined position for forming a predefined pattern of electronic components on the receiving structure; actuating the ejector assembly; transferring the individual or subset of the plurality of electronic components from the die sheet onto the receiving structure at the predetermined position; moving the receiving structure between a first press element and the superstrate or between first and second press elements; applying, using the first and/or second press elements, a compressive force to press the portion of the plurality of electronic components on the receiving structure against the adhesive layer to attach the portion of the plurality of electronic components to the superstrate; and transferring the individual or subset of the plurality of electronic components from the receiving structure onto the superstrate. In such embodiments, the superstrate is arranged so that the first side thereof faces a first side of the receiving structure.

In the embodiment shown, light emitting panel 500 comprises a two dimensional array of pixels, generally designated P. In the portion of light emitter panel 500 shown in FIG. 7, the array is 8×6, for a total of 48 pixels. In some such embodiments, the pixels P are equally spaced apart from each other in one or more direction of the array on panel 500. Those having ordinary skill in the art will understand that the number of pixels P on the light emitting panel 500 can be scaled to any number, including an amount of pixels P present in 4K and 8K micro- or mini-LED display screens.

In the embodiments shown, each pixel P has at least one white LED 124W. White LEDs 124 can be configured to emit a white light, including, for example, a light between a cool white and a warm white light. In some embodiments, each pixel P may comprise a plurality of white LEDs 124W. In some embodiments, the number of white LEDs 124W in one or more pixels P differs from at least one other pixel P. Regardless of the number of white LEDs 124W in each pixel, each of the pixels P can be controlled independently to produce substantially any light color output. In some embodiments where at least one pixel comprises a plurality of white LEDs 124W, one or more white LEDs 124W of a same pixel P may be controlled independently from each other. For example, in an embodiment where a first pixel P comprises three white LEDs 124W, each of the three white LEDs 124W in the first pixel P may be controlled independently. In some embodiments, where a pixel P comprises a plurality of white LEDs 124W, one or more of the white LEDs 124W in a pixel P can be omitted from one or more of the pixels P, based on the pre-defined pattern used to create the array of pixels P on the light emitting panel 500. In some embodiments where pixels P can comprise one or a plurality of white LEDs 124W, one or more pixels P can be omitted from the array, such that an apparent void in light emitting panel 500 is created.

In some further embodiments, a light emitting panel comprises a plurality of pixels shown in FIGS. 6 and 7, with a light emitting panel having at least a first pixel comprising a white LED (e.g., 124W, see FIG. 7) and a second pixel comprising one or more of a red LED (e.g., 124R, see FIG. 6), a blue LED (e.g., 124B, see FIG. 6), and a green LED (e.g., 124G, see FIG. 6). In some embodiments, a pixel for a light emitting panel may comprise a white LED, a red LED, a blue LED, and a green LED. In some such embodiments, one or more of the white LED, the red LED, the blue LED, and the green LED may be omitted in some or all of the pixels formed on the light emitting panel.

While the subject matter has been described herein with reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A method of transferring electronic components onto a substrate comprising a superstrate and an adhesive layer formed on at least a first side of the superstrate, the method comprising:
   positioning an ejector assembly under an individual electronic component, or a subset of a plurality of electronic components, on a die sheet;
   positioning an adhesive receiving structure at a position for forming a pattern of electronic components on the receiving structure;
   actuating the ejector assembly;
   transferring the individual electronic component, or the subset of the plurality of electronic components, from the die sheet onto the receiving structure at the position;
   moving the receiving structure between a first press element and the superstate, such that the first side of the superstrate faces a first side of the receiving structure;
   applying, using at least the first press element, a compressive force to press the individual electronic component, or the subset of the plurality of electronic components, on the receiving structure against the adhesive layer to attach the individual electronic component, or the subset of the plurality of electronic components, to the superstrate; and
   transferring the individual electronic component, or the subset of the plurality of electronic components, from the receiving structure onto the superstrate.

2. The method of claim 1, comprising removing the receiving structure after the individual electronic component, or the subset of the plurality of electronic components, are attached to the adhesive layer of the superstrate.

3. The method of claim 1, comprising arranging a second press element adjacent to the superstrate, opposite the receiving structure, wherein the first press element is arranged adjacent to the receiving structure, opposite the superstrate, and wherein the compressive force is applied using the first and second press elements.

4. The method of claim 1, wherein:
   the electronic components are light emitting devices comprising a primary light emitting surface;
   the superstrate comprises a translucent material;
   the adhesive layer is a layer of the translucent material that is not fully cured; and
   the primary light emitting surface the individual electronic component, or of each electronic component of the subset of the plurality of electronic components, is oriented to face the superstrate.

5. The method of claim 4, comprising at least partially curing the adhesive layer to set the electronic components therein by applying, using the first press element, a heat.

6. The method of claim 1, wherein the adhesive layer has an equivalent or greater degree of adhesiveness as the receiving structure.

7. A method of transferring electronic components onto a substrate comprising a superstrate and an adhesive layer formed on at least a first side of the superstrate, the method comprising:
   transporting a receiving portion of an adhesive receiving structure to a first transfer apparatus;
   positioning a first ejector assembly under an individual first electronic component, or a subset of a plurality of first electronic components, on a first die sheet, wherein each first electronic component is configured to emit a green light;
   positioning the receiving portion of the receiving structure at a first position for forming a pattern of first electronic components on the receiving portion of the receiving structure;
   actuating the first ejector assembly;
   transferring the individual first electronic component, or the subset of the plurality of first electronic components, from the first die sheet onto the receiving structure at the first position;
   transporting the receiving portion of the receiving structure to a second transfer apparatus;
   positioning a second ejector assembly under an individual second electronic component, or a subset of a plurality of second electronic components, on a second die sheet, wherein each second electronic component is configured to emit a red light;
   positioning the receiving portion of the receiving structure at a second position for forming a pattern of second electronic components on the receiving portion of the receiving structure;
   actuating the second ejector assembly;
   transferring the individual second electronic component, or the subset of the plurality of second electronic components, from the second die sheet onto the receiving structure at the second position to create a plurality of first and second electronic components on the receiving structure;
   transporting the receiving portion of the receiving structure to a third transfer apparatus;
   positioning a third ejector assembly under an individual third electronic component, or a subset of a plurality of third electronic components, on a third die sheet, wherein each third electronic component is configured to emit a blue light;
   positioning the receiving portion of the receiving structure at a third position for forming a pattern of third electronic components on the receiving portion of the receiving structure;
   actuating the third ejector assembly;
   transferring the individual third electronic component, or the subset of the plurality of third electronic components, from the third die sheet onto the receiving structure at the third position to create a plurality of first, second, and third electronic components;
   transporting the receiving portion of the receiving structure to a placement apparatus;
   moving the receiving portion of the receiving structure through a gap between the superstrate and a press element, such that the first side of the superstrate faces a first side of the receiving structure; and
   applying, using the press element, a compressive force to press the first, second, and third electronic components on the receiving structure against the adhesive layer of the superstrate to attach the first, second, and third electronic components to the superstrate.

8. A light emitter panel produced according to a method of transferring electronic components onto a substrate comprising a superstrate and an adhesive layer formed on at least a first side of the superstrate, the method comprising:
   positioning an ejector assembly under an individual electronic component, or a subset of a plurality of electronic components, on a die sheet;
   positioning an adhesive receiving structure at a position for forming a pattern of electronic components on the receiving structure;
   actuating the ejector assembly;

transferring the individual electronic component, or the subset of the plurality of electronic components, from the die sheet onto the receiving structure at the position;

moving the receiving structure between a first press element and the superstate, such that the first side of the superstrate faces a first side of the receiving structure;

applying, using at least the first press element, a compressive force to press the individual electronic component, or the subset of the plurality of electronic components, on the receiving structure against the adhesive layer to attach the individual electronic component, or the subset of the plurality of electronic components, to the superstrate; and transferring the individual electronic component, or the subset of the plurality of electronic components, from the receiving structure onto the superstrate.

9. The method of claim 1, comprising arranging a backing support adjacent to the receiving structure on an opposite side thereof from the die sheet.

10. The method of claim 1, wherein:
the ejector assembly comprises:
an ejector pin; and
a vacuum chamber arranged around a perimeter of the ejector pin; and
actuating the ejector assembly comprises:
longitudinally extending the ejector pin in a direction towards the receiving structure; and
applying a suction force to an underside of the die sheet, opposite a top side thereof on which the plurality of electronic components are arranged, to cause a localized deformation of the die sheet adjacent to the ejector pin to prevent an attachment of adjacent electronic components on the die sheet to the receiving structure.

11. The method of claim 1, wherein the electronic components are light emitting devices.

12. The method of claim 1, wherein:
the plurality of electronic components are arranged on the die sheet in an array; and
the pattern of electronic components is a two-dimensional array of electronic components.

13. The method of claim 1, wherein one or more of the die sheet, the receiving structure, and the ejector assembly are movable, independently of each other, along an x-direction, a y-direction, a z-direction, a $\varphi$-direction, and/or a $\psi$-direction.

14. The method of claim 1, comprising:
disposing a mask with gaps formed therein between the receiving structure and the die sheet;
aligning the individual electronic component, or each electronic device of the subset of the plurality of electronic components, with one of the gaps formed in the mask; and
pressing the individual electronic component, or the subset of the plurality of electronic components, against the receiving structure at the position through the one of the gaps.

15. The method of claim 14, comprising forming the mask adjacent to a surface of the receiving structure, against which the individual electronic component, or the subset of the plurality of electronic components, are pressed by the ejector assembly to form the pattern of electronic components.

* * * * *